(12) United States Patent
Zeller (10) Patent No.: US 10,761,169 B2
(45) Date of Patent: Sep. 1, 2020

(54) METHOD AND APPARATUS FOR RECORDING A MAGNETIC RESONANCE DATA SET WITH MAGNETIC RESONANCE SIGNALS FROM AT LEAST TWO SLICES

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 90 days.

(21) Appl. No.: 16/047,233

(22) Filed: Jul. 27, 2018

(65) Prior Publication Data

US 2019/0033408 A1    Jan. 31, 2019

(30) Foreign Application Priority Data

Jul. 27, 2017 (EP) .................................... 17183490

(51) Int. Cl.
  *G01R 33/483* (2006.01)
  *G01R 33/561* (2006.01)
  *G01R 33/36* (2006.01)
  *G01R 33/54* (2006.01)
  *G01R 33/56* (2006.01)

(52) U.S. Cl.
  CPC ..... *G01R 33/4835* (2013.01); *G01R 33/3607* (2013.01); *G01R 33/543* (2013.01); *G01R 33/5611* (2013.01); *G01R 33/5602* (2013.01)

(58) Field of Classification Search
  CPC ............ G01R 33/4835; G01R 33/5611; G01R 33/543; G01R 33/3607; G01R 33/5602
  USPC .................................................... 324/309
  See application file for complete search history.

(56) References Cited

U.S. PATENT DOCUMENTS

| | | | |
|---|---|---|---|
| 4,748,409 A | 5/1988 | Frahm et al. | |
| 4,972,148 A * | 11/1990 | Jensen | G01R 33/4835 324/307 |
| 9,995,809 B2 * | 6/2018 | Speier | G01R 33/4835 |
| 2009/0179641 A1 * | 7/2009 | Matsuda | G01R 33/4835 324/309 |
| 2013/0285656 A1 * | 10/2013 | Feiweier | G01R 33/56572 324/309 |
| 2014/0167754 A1 * | 6/2014 | Jerecic | G01R 33/56 324/309 |
| 2015/0108975 A1 * | 4/2015 | Grodzki | G01R 33/543 324/309 |
| 2015/0260820 A1 | 9/2015 | Speier | |

(Continued)

OTHER PUBLICATIONS

Cauley,. et. al.: "Interslice Leakage Artifact Reduction Technique for Simultaneous Multislice Acquisitions", Magnetic Resonance in Medicine, vol. 72, pp. 93-102, (2014).

(Continued)

*Primary Examiner* — Christopher P McAndrew
(74) *Attorney, Agent, or Firm* — Schiff Hardin LLP (57) ABSTRACT

In a method and apparatus for recording a magnetic resonance (MR) data set with MR signals from at least two slices, a first radio-frequency (RF) pulse is radiated in at least one first slice, a second RF pulse is radiated in at least one second slice, and readout of at least one first and at least one second MR signal takes place. The flip angle of the second RF pulse is smaller than the flip angle of the first RF pulse.

14 Claims, 6 Drawing Sheets

(56) References Cited

U.S. PATENT DOCUMENTS

2015/0276907 A1* 10/2015 Ouyang ........... G01R 33/56366
                                                            324/309
2016/0238685 A1*  8/2016 Neji ................... G01R 33/4835
2017/0108567 A1   4/2017 Bhat et al.
2017/0146625 A1*  5/2017 Beck ................. G01R 33/4835
2017/0315202 A1  11/2017 Bhat et al.
2018/0031659 A1   2/2018 Bhat et al.

OTHER PUBLICATIONS

Setsompop, et.al.; "Blipped-Controlled Aliasing in Parallel Imaging far Simultaneous Multislice Echo Planar Imaging with Reduced g-Factor Penalty", Magnetic Resonance in Medicine, vol. 67, pp: 1210-1224, (first published online 2011); (2012).

Haase, et al.: "MR Imaging Using Stimulated Echoes (STEAM)"; Radiology; vol. 160; pp. 787-790 (1986).

Finsterbusch, et. al.; "Half-Fourier Single-Shot STEAM MRI"; Magnetic Resonance in Medicine; vol. 47; pp. 611-615; (2002).

Setsompop, et.al.: "Improving diffusion MRI using simultaneous multi-slice echo planar imaging", NeuroImage, vol. 63 pp. 569-580, (2012).

* cited by examiner

FIG 2

METHOD AND APPARATUS FOR RECORDING A MAGNETIC RESONANCE DATA SET WITH MAGNETIC RESONANCE SIGNALS FROM AT LEAST TWO SLICES

BACKGROUND OF THE INVENTION

Field of the Invention

The invention concerns a method for recording a magnetic resonance (MR) data set with magnetic resonance signals from at least two slices, as well as an MR apparatus, and a non-transitory data storage medium encoded with programming code that implement such a method.

Description of the Prior Art

In magnetic resonance examinations, it is necessary to wait for spin echo-based sequences or a gradient echo to occur after the magnetization of the relevant nuclear spins has been excited and the signal therefrom has been read out so that the longitudinal magnetization can be detected and reconstructed.

In the case of gradient echo-based sequences, for acceleration the approach is to use an excitation angle (flip angle) of less than 90° from the steady state imposed by the basic magnetic field, thereby greatly reducing the repetition time. Such sequences are known under the name Fast Low Angle SHot, FLASH for short.

This approach was also used for spin echo-based imaging. However, spin-echo sequences such as FATE or RASEE have been unable to prevail, because the refocusing pulse or pulses used therein result in such a signal loss that the time saved is not worthwhile compared to the expense, for example, in the form of SAR.

If a volume is to be examined, either a number of slices therein can be individually recorded, or a three-dimensional data set of the entire volume can be acquired. In the case of a spin echo sequence, it is possible to record the other slices in each of the waiting times that occur after the acquisition of the measurement signal for a particular slice. Although the measurement time is essentially longer here than in other sequences, more slices can be recorded during this measurement time. Theoretically, there can be at most as many slices as the number of echo times TE that fit into the repetition time TR. Acquisition, therefore, always takes place in one slice, while the longitudinal magnetization can build up in the other slices.

The number of measurable slices is actually lower in practice, because there may be steps, such as the creation of gradients before the excitation pulse and after the readout, which must be executed but that are not taken into consideration when calculating the echo time TE.

If an echo time of 30 ms is assumed and a waiting time of 1 s after the readout of the signal, a number of approx. 30 slices is obtained which can theoretically be recorded the spin echo technique, without increasing the measurement time.

Another possibility for reducing the measurement time is the use of a number of readout coils. This approach is also called parallel imaging. In this case, the measurement signal is recorded simultaneously by multiple coils, but only some of the k-space lines are recorded (filled). The signals are separated, i.e., allocated to respective coils) using the known sensitivity profile of the coils, and the missing k-space lines are then calculated and the respective coil data sets are combined. This procedure is known under the acronym GRAPPA.

Separation in the image domain is also possible.

In this case, there is the opportunity to also perform multi-slice measurements in parallel by such parallel imaging. This is known under the name simultaneous multislice (SMS) imaging. A so-called multiband radio-frequency pulse can be used for simultaneous excitation of nuclear spins in multiple slices. The echo signals of the individual slices occur simultaneously and are recorded simultaneously. The separation of the measurement signals initially takes place with respect to slices, and then inside the individual slices. In this case, it is customary to not only use the coil array to enable separation of the slices, but also to accelerate the imaging in the individual slices.

A multiband pulse can be generated in the following manner:

A slice-selective, complex-valued radio-frequency pulse can be described as $$RF(t)=A(t)*P(t).$$

In this case, A(t) is a standard pulse profile that is established by interaction with the slice selection gradient. P(t) is a phase modulation function that indicates the slice position $\Delta\omega$ and its phase $\varphi$ at the time TE=0 as $$P(t)=\exp(i\Delta\omega t+\varphi).$$

By adding several such radio frequency pulses with different phase modulation functions, a multiband radio frequency pulse $RF_{MB}$ is obtained:

$$RF_{MB}=A(t)*\text{sum}_N(\exp(i\Delta\omega_N t+\varphi_N)).$$

The running index or control variable N denotes the individual radio-frequency pulses. The multiband radio-frequency pulse is therefore a sum of single-band pulses in this embodiment.

The recorded measurement signals must first be separated as described. To this end, methods operating in the image domain such as Partially Parallel Imaging With Localized Sensitivities (PILS) or Sensitivity Encoding (SENSE) can be used.

Alternatively, separation is also possible in k-space, as in the case of Simultaneous Acquisition of Spatial Harmonics (SMASH) with the further developments AUTO-SMASH and Variable Density (VD-) AUTO-SMASH or Generalized Autocalibrating Partially Parallel Acquisitions (GRAPPA).

The deconvolution method is preferably implemented in two stages. First, to separate the signals of the different slices and then, to separate the signals inside the slices.

In order to obtain a high acceleration and a high SNR, Multi-Slice Controlled Aliasing In Parallel Imaging Results IN Higher Acceleration (MS-CAIPIRINHA) can be used for data acquisition. With MS-CAIPIRINHA, a multiband radio-frequency pulse simultaneously excites a number of slices. The slices are separated from each other and arranged in parallel. The spatial coding is the same for all slices.

In order to also be able to separate the slices without using a coil array, a slice-specific RF phase is impressed in each slice. As a result, the slices can be distinguished and separated.

As described, this enables the acquisition of simultaneously recorded measurement signals in a number of slices without the use of a coil array, but a coil array can still be used to facilitate and further improves the separation.

The use of a turbo spin echo sequence as an imaging module can lead to a high SAR entry which is higher, the more slices are recorded.

SUMMARY OF THE INVENTION

Based on the above, it is an object of the present invention to provide a method for recording a magnetic resonance data set in which measurement signals are acquired from a number of slices, and wherein the measurement time for a given range of information is minimized and, at the same time, the SAR kept is as low as possible.

This object is achieved by a method for recording a magnetic resonance (MR) data set with MR signals from at least two slices, which includes operating an MR data acquisition scanner in a data acquisition sequence in which a first radio-frequency (RF) pulse is radiated that acts on nuclear spins in at least one first slice of a subject, a second RF frequency pulse is radiated that acts on nuclear spins in at least one second slice of the subject, and in which at least one first MR signal and at least one second MR signal are read out with the flip angle of the second radio-frequency pulse being smaller than the flip angle of the first radio-frequency pulse.

Image data are reconstructed from the at least one first MR signal and the at least one second MR signal, and the image data are made available in electronic form as a data file, for archiving and/or display.

The basis of the invention is considered to be the interlinking of the recording of at least two image data sets with different contrasts, such that a minimum measurement time is obtained and the SAR is simultaneously minimized. This is achieved by the application of different RF pulses. The difference is achieved by different flip angles. The flip angle of a radio-frequency pulse, also referred to as an excitation angle, is as noted above, the angle by which the rotation axis of the nuclear spins is deflected out of its equilibrium position by the RF pulse.

In this case, the flip angle of the second radio-frequency pulse is smaller than that of the first radio-frequency pulse. The attributes "first" and "second" serve merely to distinguish the slices and do not make any determinations as to the duration, the time or sequence of application, or any other property of the RF pulses.

In this case, the first and the second RF pulse are each radiated at least once in the course of an excitation cycle.

A measurement sequence is composed of defined or definable partial measurements or scans. A partial measurement can also be called an excitation cycle. These partial measurements are repeated until the required amount of measurement signals for making the diagnosis in question are acquired.

In a spin echo sequence, for example, as many excitation pulses are applied as phase coding steps are performed. Accordingly, there are as many excitation cycles as phase coding steps.

In the case of a turbo spin echo, also referred to as a fast spin echo or RARE, a number of refocusing pulses are used, for which reason the resulting echoes are referred to as an echo train. A turbo spin echo with 128 phase coding steps and a number of 8 echoes in the echo train therefore results in a quantity of only 16 excitation cycles for recording a complete measurement data set.

When using a coil array and evaluation procedure of parallel imaging, the number of excitation cycles decreases as some of the measurement signals are not excited and therefore not measured either. The number of excitation cycles then decreases by the number that results from the acceleration factor. However, in the case of parallel imaging, an excitation cycle is also a partial experiment which is repeated several times.

The measurement signals are preferably configured as echo signals. In the case of imaging experiments, echo signals are recorded, in the case of spectroscopic experiments and chemical shift imaging (CSI), FIDs. In other words, the measurement sequences are preferably imaging sequences.

The first RF pulse and the second RF pulse are preferably radiated with the same frequency in the course of an excitation cycle. The same number of measurement signals can then be recorded in all the slices in an excitation cycle.

The first RF pulse and the second RF pulse do not have to be present at the same time. They do not need to have the same pulse profile or the same length and/or duration.

Advantageously, the slices are arranged in parallel. This is customary for multi-slice experiments but not mandatory. In the case of parallel arrangement, signal cancellations in overlapping areas are avoided.

The first RF pulse and the second RF pulse preferably have the same pulse profile. For example, both are Gaussian pulses or sinc pulses. They may also be pulses generated according to the known Shinnar-Le Roux method.

Advantageously, the measurement signals are acquired with a coil array. A coil array is a multi-channel antenna with a number of individual coils. The acceleration factor in parallel imaging is also limited by the number of coils.

Advantageously, the first RF pulse and the second RF pulse can be parts (signal components) of a multiband radio-frequency pulse. Then the RF pulses are present simultaneously. In this case, the sequence can be attributed to the simultaneous multislice imaging.

Preferably, each slice can be imposed with a slice-specific RF phase. Preferably, the first RF pulse and/or the second RF pulse impose the phase. This can take place with and without the embodiment of a multiband radio-frequency pulse. As described above, this facilitates the deployment of the slices and/or makes this possible only when a single receiving coil is used. This procedure is advantageous if more than one echo is read out at the same time from a number of slices.

Advantageously, the first RF pulse and the second RF pulse are applied simultaneously. This is automatically the case for multiband RF pulses but can also be realized by using a number of coils.

Preferably, a refocusing pulse is used as the first RF pulse. In particular, a spin echo-based measurement sequence can be used in the first slice or the first slices. The first RF pulse is then not the only RF pulse that is applied in this slice. In particular, a spin echo or a turbo spin echo or a HASTE sequence can be used as a spin echo-based measurement sequence.

Advantageously, a flip angle of less than 70° can be used as the flip angle of the second RF pulse. In particular, a gradient echo-based measurement sequence can be used in the second slice or in the second slices. In particular, a FLASH or a TrueFISP sequence can be used as a gradient echo-based measurement sequence.

In the second slice, a steady-state sequence is preferably used. FLASH or TrueFISP are examples of steady-state sequences.

Preferably, the first RF pulse is preceded by an excitation pulse. If the first RF pulse is designed as a refocusing pulse, this is necessary in order to obtain a signal. In particular, the excitation pulse can have a flip angle of 90°.

Advantageously, the first RF pulse can be preceded by an inversion pulse. The latter is preferably also preceded by the excitation pulse. With this pulse sequence and the correct waiting time TI after the inversion pulse, a FLAIR-weighted turbo spin echo can be generated for signal recording in the first slice or slices.

In this case, the excitation pulse and the inversion pulse are applied only in the first slice.

It should be noted that all RF pulses apart from multiband RF pulses in the present invention are preferably always applied in only one slice. Otherwise, for example, the inversion pulse would precede not only the first RF pulse but also the second RF pulse. The first RF pulse is likewise present in only one slice as only the multiband RF pulse is present as a whole in a number of slices. In contrast, the individual parts, in particular the first RF pulse and the second RF pulse, are only ever present in one slice.

Advantageously, the second RF pulse can be preceded by a preparation pulse. The latter is used, when a steady-state sequence is employed in the second slice, for the excitation and preparation of magnetization. It can be designed in exactly the same way as the excitation pulse in the first slice, in particular, its flip angle can be 90°. However, it is not part of the imaging module of the sequence but part of the preparation module.

Advantageously, the second RF pulse can be preceded by a storage pulse. The latter can follow the preparation pulse. With the preparation pulse and the storage pulse, a STEAM imaging in the second slice can be achieved. STEAM is the acronym for STimulated Echo Acquisition Mode. After excitation and possibly flux or diffusion preparation, magnetization is stored in the longitudinal direction where it undergoes T1 relaxation. The storage pulse therefore preferably also has a flip angle of 90°.

In this case, a number of first and second slices can be recorded simultaneously. The adjectives "first" and "second" should, as described, serve only to distinguish the slices. For example, five first and five second slices can be recorded simultaneously. In this case, the first and second slices can each form a block. However, they can also be arranged in alternation with each other.

Furthermore, in at least one third slice, a third RF pulse can be applied which is preceded by a preparation pulse and/or a storage pulse, wherein the interval between the preparation pulse and/or storage pulse for the third RF pulse is longer than the interval between the preparation pulse and/or storage pulse for the second RF pulse. There can therefore be two slices with a different STEAM preparation.

Advantageously, the first and/or the second RF pulse can be applied several times in an excitation cycle. As described, this may involve the use of a turbo spin echo and/or a steady-state-sequence. It is not significant whether the steady state is actually reached, but that it would be achieved by applying a sufficient number of second RF pulses.

Advantageously, the slices can be recorded at least twice, wherein in the second recording, the at least one second slice is located at the position at which the at least one first slice was recorded during the first recording and vice versa. In other words, the position of the slices is reversed. The advantage in the end lies in having an image at each of the slice positions, for example, with a T2-weighted contrast and a T1-weighted contrast, wherein the SAR can be kept in a middle range in the individual measurements.

Preferably, the measurement data of the individual slices are separated from the recorded measurement data set using a GRAPPA method. As described, simultaneously recorded measurement signals must first be assigned to individual slices.

Preferably, the measurement data of the individual slices can be separated using a GRAPPA method. This is necessary for undersampled measurement data. Preferably, the measurement data can be recorded with a coil array. Thus, parallel imaging can be used for recording measurement data.

The present invention also encompasses a non-transitory, computer-readable data storage medium encoded with programming instructions that, when the storage medium is loaded into a control computer or computer system of a magnetic resonance apparatus, cause the control computer or computer system to operate the magnetic resonance apparatus so as to implement any or all embodiments of the method according to the invention, as described above.

For example, the computer-readable storage medium, also referred to as a data carrier, can be a hard disk, a cloud, an SD card, a CD-ROM, a USB stick or another digital storage medium.

The present invention also encompasses a magnetic resonance imaging apparatus that has a magnetic resonance data acquisition scanner and a control computer or computer system, wherein the control computer or computer system is configured to operate the apparatus, in particular the scanner, in order to implement any or all embodiments of the method according to the invention, as described above.

The aforementioned method can be implemented in the control computer as software, but also as (hard-wired) hardware.

Embodiments of the magnetic resonance apparatus according to the invention correspond to the described embodiments of the method according to the invention.

DESCRIPTION OF THE PREFERRED EMBODIMENTS

Figure 1:
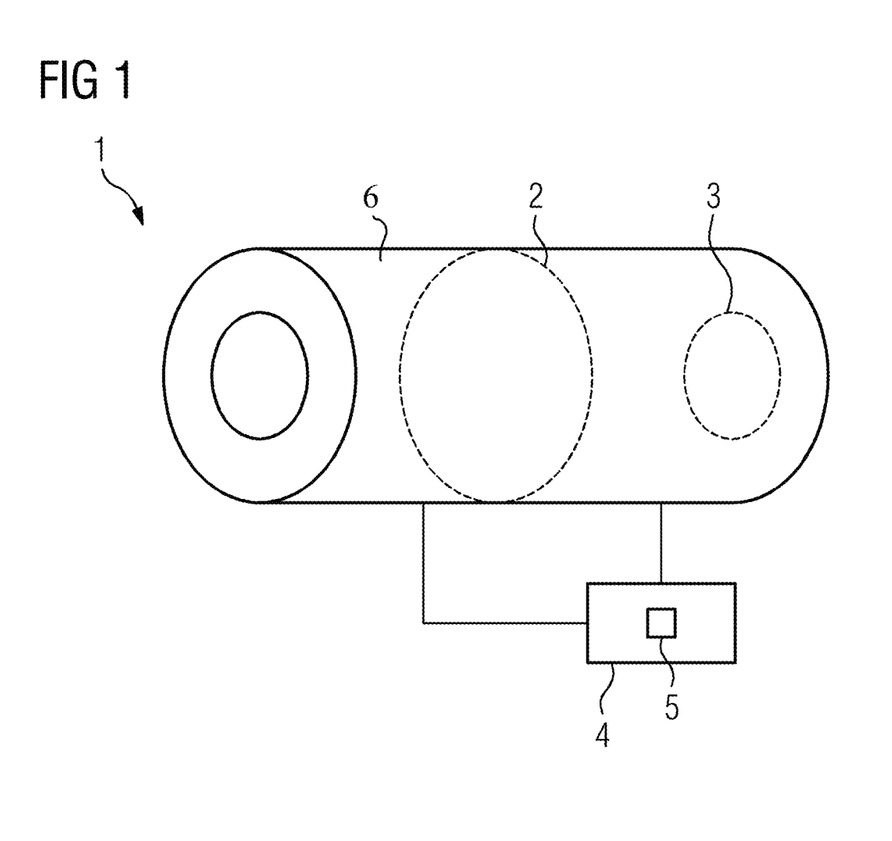
FIG. 1 schematically illustrates a magnetic resonance apparatus.

FIG. 1 shows a magnetic resonance apparatus 1 having a data acquisition scanner 6 with a transmitter coil arrangement 2 and a receiver coil arrangement 3. The receiver coil arrangement 3 can be designed as a coil array.

The measurement time can be reduced with a receiver coil arrangement 3 designed as a coil array when corresponding post-processing methods such as PILS, GRAPPA or SENSE are used for the reconstruction of the sub-sampled data sets.

A control computer 4 controls the magnetic resonance apparatus 1, i.e., the scanner 6 thereof.

The scanner 6 also includes standard components such as a basic field magnet and a gradient coil arrangement (not shown).

Furthermore, the magnetic resonance system 1 has a non-transitory computer-readable storage medium, in particular, a data carrier 5. The data carrier 5 can be designed as part of the control computer 4 or independently thereof. In particular, measurement sequences in the form of programming instructions (program code) are stored on the data carrier 5. This is a chronological sequence of radio-frequency pulses, gradient fields, acquisition windows and waiting times by which the measurement sequence is defined. By invoking, for example, a turbo spin echo sequence, with or without parallel imaging, a measurement data set with a turbo spin echo sequence can be recorded. These steps are executed under the control computer 4 to perform a scan of an examination subject by providing appropriate control signals individually to the respective components of the scanner 6.

Figure 2:
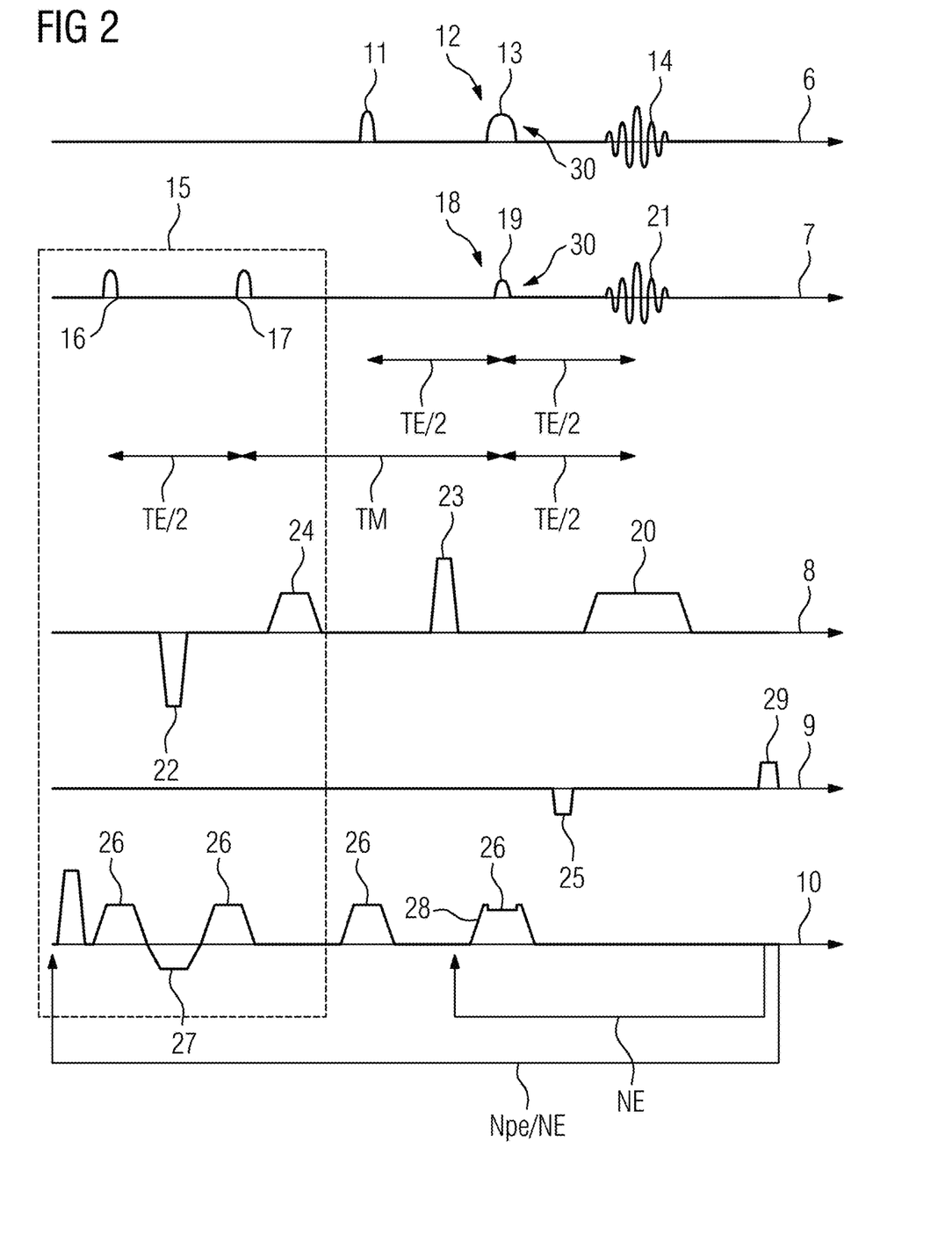
FIG. 2 shows a sequence diagram of a simultaneous multislice imaging sequence in a first embodiment of the invention.

FIG. 2 shows a sequence diagram of a simultaneous multislice imaging sequence. Five time axes 6, 7, 8, 9 and 10 are shown wherein, for clarity, the axis on which the RF pulses and measurement signals are shown has been divided. The RF pulses and echo signals of the first slice are plotted on the axis 6 and the RF pulses and echo signals of the second slice on the second axis 7. The echo signals are naturally not separated in reality and can only be acquired jointly. A separation strategy is therefore required which, for example, is executed in the form of a separation algorithm.

On the time axis 8, the gradients are applied in the readout direction, on the axis 9 the gradients are applied in the phase direction and on the axis 10 the gradients are applied in the slice selection direction.

A T2-weighted turbo spin echo is recorded in the first slice by the sequence shown in FIG. 2. Accordingly, an excitation pulse 11 is shown on the time axis 6 and a refocusing pulse 13 as the first RF pulse 12. The excitation pulse 11 preferably has a flip angle of 90° and the refocusing pulse 13 a flip angle of 180°.

This pulse sequence generates a spin echo or general echo signal 14.

Through repeated application of the refocusing pulse 13, an echo train is generated and a number of echo signals 14 can thus be recorded with one excitation. The number of echoes determines the factor of the acceleration which is achieved in comparison to a spin echo sequence with an echo number of 1. The refocusing pulse 13 is applied NE times, whereby NE echoes are recorded in one go. NE is an abbreviation of "number of echoes".

In turbo spin echo sequences, the T2-weighting of the central k-space lines can be established on the basis of the acquisition scheme. In the case of a "centric" acquisition scheme, the central k-space lines can always be placed in the first echo of an echo train. A higher SNR is thus obtained.

If the k-space lines are scanned in a "linear" fashion, the central k-space lines are located in the center of the echo train, starting on one side of k-space and ending on the other. The resulting image is then T2-weighted.

If the acquisition scheme is "centric reordered", the central k-space lines are located around the center of k-space, wherein the sides are constantly changed in the ky-direction.

The interval between the excitation pulse 11 and the refocusing pulse 13 as well as between the refocusing pulse 13 and the echo signal 14 is TE/2. As usual, the echo time TE indicates the time interval between the excitation pulse 11 and the echo signal 14.

The interval between the first echo signal 14 and the second refocusing pulse 13 need not be TE/2, then the distance between the second refocusing pulse 13 and the second echo signal 14 is also changed accordingly. A preferred interval is TE/2, however.

In the second slice, and thus applied to the time axis 7, first there is a preparation module 15 that includes a preparation pulse 16 and a storage pulse 17. The preparation pulse 16 folds the magnetization into the transverse plane. The storage pulse 17 folds the magnetization back into the longitudinal plane after a period ES/2. The magnetization of the second slice is therefore subject to T1 relaxation. In this case, for example, the first of two bipolar gradients for flow or diffusion coding can be arranged between the preparation pulse 16 and the storage pulse 17. ES/2 can be as long as TE/2, but need not be. This is only important if the second RF pulse 12 has a flip angle of 90° and the storage pulse 17 and the RF pulse 12 together generate a spin echo. This is not the case in the embodiment described.

To read out the signal of the second slice, excitation pulses 19 having a flip angle of less than 70°, preferably less than 20°, are preferably used as second RF pulses 18.

If the excitation pulses 19 are applied at the same time as the refocusing pulses 13 and the readout gradients 20 applied correctly, the echo signals 21 are produced at the same time as the echo signals 14.

NE echo signals 21 can then also be obtained with the STEAM sequence in the second slice.

Furthermore, the sequence can have a read dephasing gradient 22 for dephasing the magnetization of the second slice and a read dephasing gradient 23 for dephasing the magnetization of the first slice. The gradients 22 and 23, like all the other gradients, are present in all the slices but at the time of the application of the read dephasing gradient 22, the magnetization of the first slice has not yet been excited, while the magnetization of the second slice has been folded back into the longitudinal direction when the read dephasing gradient 23 is applied.

The spoiler gradients 24 are used for a final dephasing and thus a destruction of the signal, while the read dephasing gradients are intended to pre-compensate for the read gradient 20.

In addition, phase gradients 25 and slice selection gradients 26 and a slice rephasing gradient 27 are used. The slice selection gradients 26, which are parallel to the refocusing pulses 13, may be surrounded by crusher gradients 28. Crusher gradients 28 are arranged symmetrically around refocusing pulses and dephase all signal components which are not folded over by 180°. They therefore serve to correct imperfections of the refocusing pulse 13.

The phase-rephasing gradients compensate the phase gradients 25. They have the same effective moment, only with the opposite sign.

Assuming a complete Cartesian scan, this excitation cycle shown in FIG. 2 is run through Npe/NE times in order to be able to obtain a complete image. With parallel imaging, a correspondingly reduced number of passes is sufficient. Npe denotes the number of phase encoding steps.

The refocusing pulse 13 and the excitation pulse 19 are shown as separate pulses. However, they can also be designed as parts of a multiband radio-frequency pulse 30.

Figure 3:
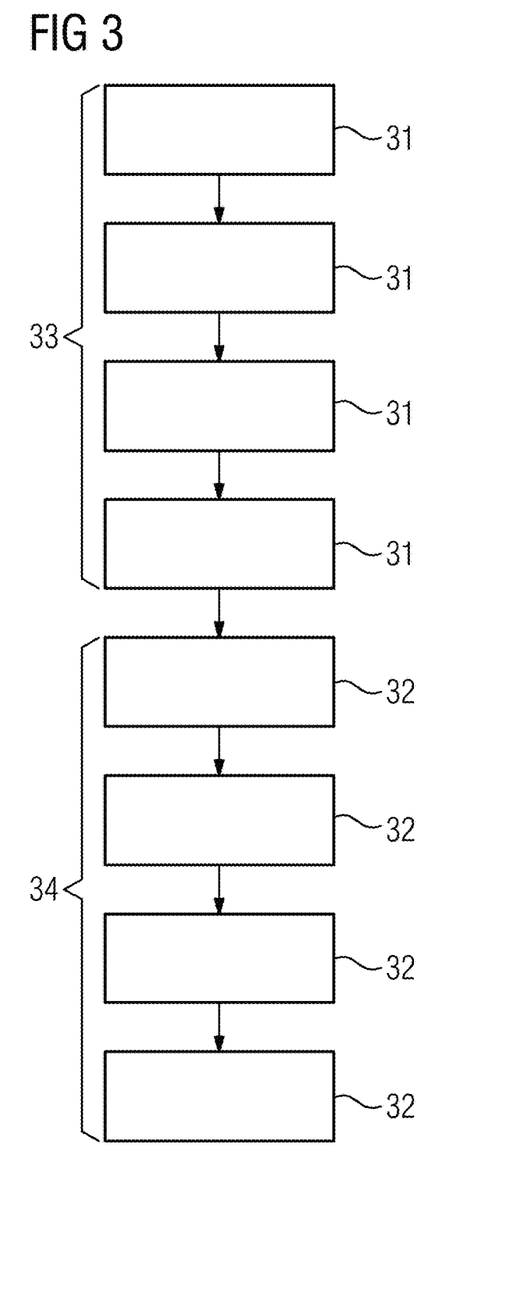
FIG. 3 shows an arrangement of first and second slices in a first embodiment of the invention.

FIG. 3 shows a first possible arrangement of the first slices 31 and the second slices 32. As already described above, at least one first slice 31 and at least one second slice 32 are present. However, it is also possible, for example, to use five first slices 31 and five second slices 32 respectively. These are arranged as block 33 and 34 in FIG. 3.

Figure 4:
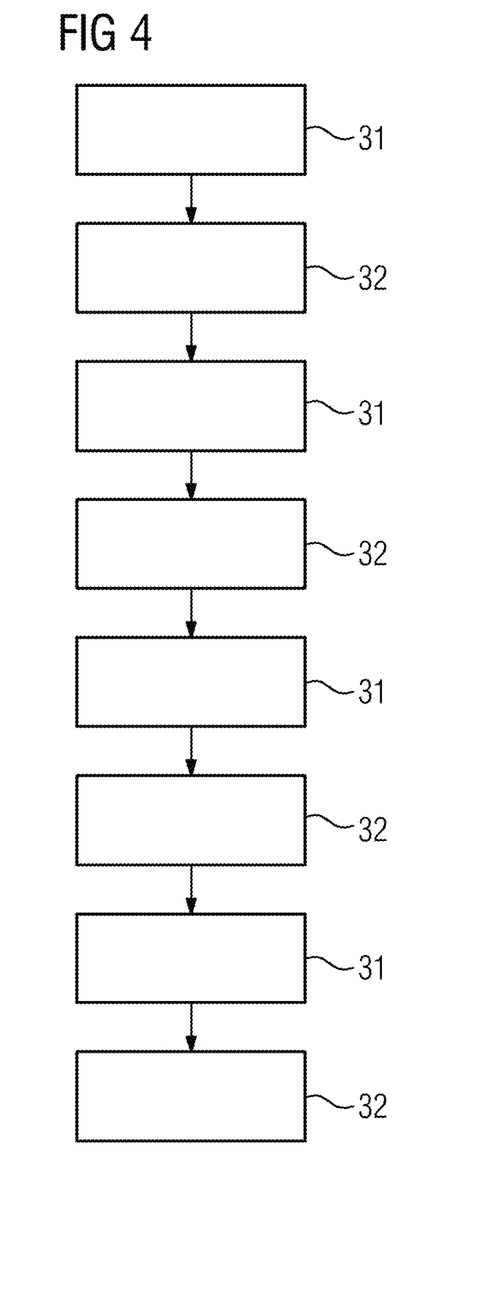
FIG. 4 shows an arrangement of first and second slices in a second embodiment of the invention.

FIG. 4 shows another arrangement. Here the first slices 31 and the second slices 32 are arranged alternately. With this arrangement, possible crosstalk effects can be at least partially reduced.

Figure 5:
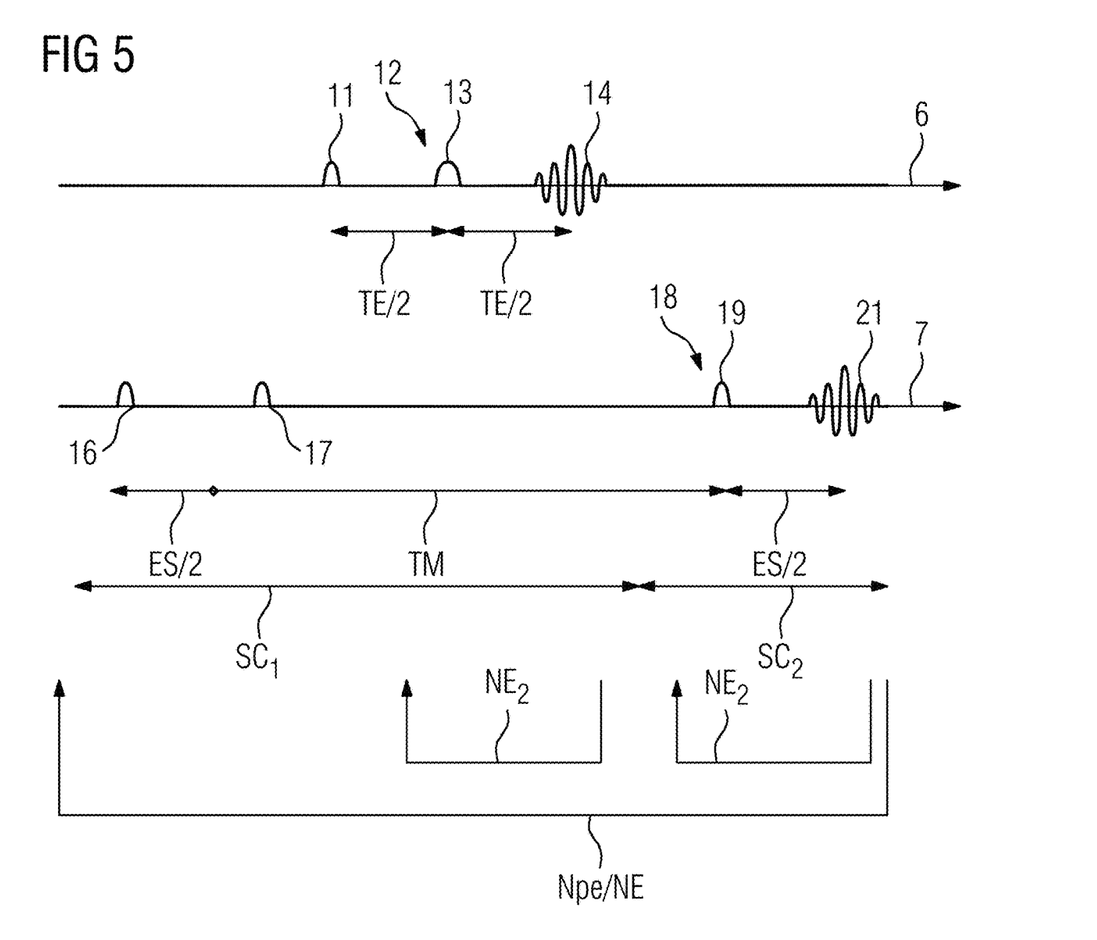
FIG. 5 shows a sequence diagram of a multi-slice sequence of the invention.

FIG. 5 shows a further possible embodiment of a measurement sequence 35 for receiving the echo signals 14 and 21. In this case, however, the partial sequences are not executed in parallel but are nested one inside the other. The same reference characters denote the same elements as in FIG. 2, to which reference is hereby made.

In this arrangement, the preparation time TM of the preparation module 15 can be extended without influencing the echo time TE of the measurement of the other slice. Long preparation times TM are obtained, for example, in the preparation of flow speeds in the range of 1 mm/s, in diffusion measurements or in certain signal contrasts.

In this way, two sections $SC_1$ and $SC_2$ are obtained, the spin echoes being recorded as echo signals 14 in the first section $SC_1$ and the echo signals 21 in the second section $SC_2$.

In this arrangement, the time intervals TE/2 and ES/2 are completely independent of one another.

In principle, different numbers of echo signals 14 and/or 21 can be recorded in an excitation cycle. These are indicated by the repetitions $NE_1$ and $NE_2$. If, in an excitation cycle, however, different numbers of echo signals 14 and 21 are recorded, assuming an equal number of k-space lines to be recorded, at the end of the recording time the missing lines are still to be acquired in the slice in which fewer k space lines have been recorded hitherto. With different resolutions, however, it may just be a goal to record an unequal number.

Figure 6:
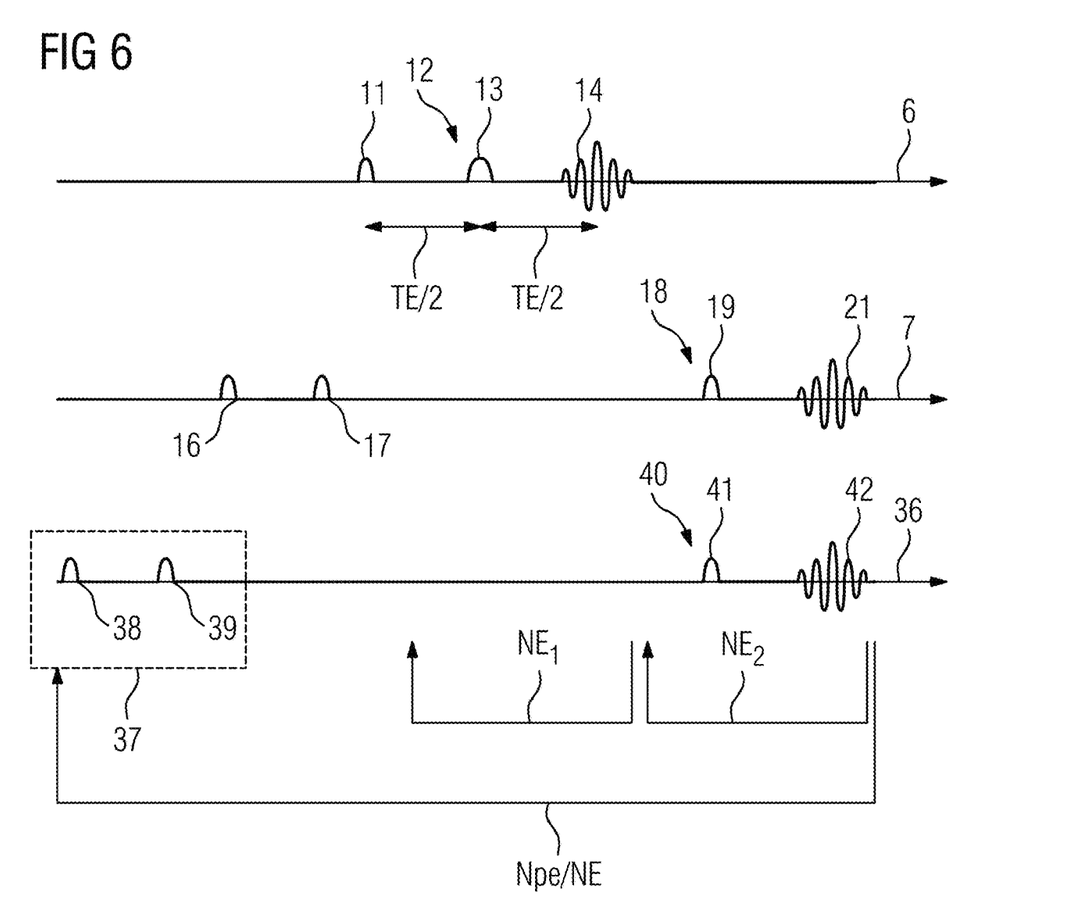
FIG. 6 shows a sequence diagram of a simultaneous multislice imaging sequence in a second embodiment of the invention.

FIG. 6 shows a further sequence diagram of a simultaneous multislice imaging sequence. In this case, three time axes 6, 7 and 36 are shown, the RF pulses and acquisition window for a third slice being shown on the time axis 36. In this case, there is a further preparation module 37 with a preparation pulse 38 and a storage pulse 39 before the preparation module 15. The third RF pulse 40 in the form of the excitation pulse 41 is applied at the same time as the second RF pulse 18.

Apart from the time interval between the preparation module 37 and the excitation pulse 38, the pulse sequences on the time axes 7 and 37 are identical. The echo signal 42 of the third slice is thus recorded at the same time as the other echo signals 14 and 21.

The gradient time axes 8 and 9 correspond to those in FIG. 2, in the direction of shift selection the gradients of the preparation module 15 are also applied to the preparation module 37.

Figure 7:
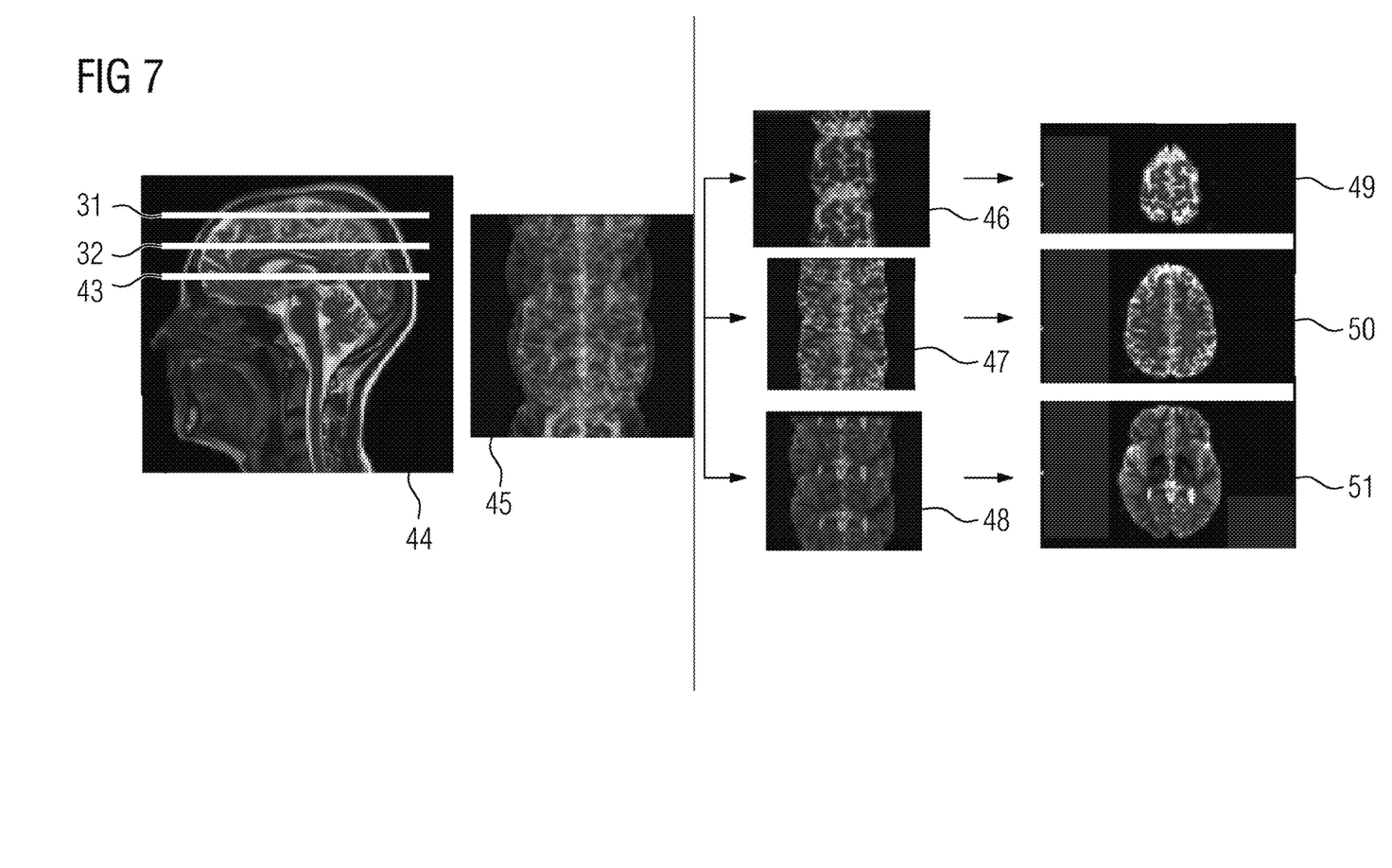
FIG. 7 is a flowchart of the method for processing simultaneous multislice imaging sequence-measurement data in accordance with the invention.

FIG. 7 shows a procedure for recording and processing a simultaneous multislice imaging data set. Initially, three slices 31, 32 and 43 are established in an overview data set 44. After the recording of the measurement signals, for example with the measurement sequence shown in FIG. 6, a measurement data set 45 is obtained in which measurement signals from the three slices 31, 32 and 43 are contained. It is not shown here that the echo signals 14, 21 and 42 contain an impressed phase, that is, for example, are MS-CAIPIRINHA-prepared.

The measurement signals 14, 21 and 42 can be separated into the individual measurement data 46, 47 and 48 by a deconvolution method such as GRAPPA. As these are subsampled, the GRAPPA method is used again inside the slices to obtain the separated image data 49, 50 and 51.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus comprising an MR data acquisition scanner comprising a computer and MR data acquisition scanner having a radio-frequency (RF) radiator, said method comprising:
   with said computer, operating the MR data acquisition scanner in order to execute an MR data acquisition sequence in order to acquire MR data from a subject;
   in said MR data acquisition sequence, operating the RF radiator of the MR scanner in order to radiate a first RF pulse that acts on nuclear spins in at least one first slice of the subject;
   also in said MR data acquisition sequence, operating said RF radiator in order to radiate a second RF pulse that acts on nuclear spins in at least one second slice of the subject;
   operating said RF radiator so as to radiate said first RF pulse and said second RF pulse as respective components of a multiband RF pulse;
   operating said RF radiator in said MR data acquisition sequence to radiate said second RF pulse with a flip angle that is smaller than a flip angle of said first RF pulse;
   in said MR data acquisition sequence, operating said MR scanner so as to read out said MR data, comprising reading out at least one first MR signal from said at least one first slice and reading out at least one second MR signal from said at least one second slice; and
   in said computer, reconstructing image data from said MR data and making the image data available in electronic form from said computer as a data file.

2. A method as claimed in claim 1 comprising radiating said first RF pulse and said second RF pulse so as to respectively act simultaneously on said nuclear spins in said at least one first slice and said nuclear spins in said at least one second slice.

3. A method as claimed in claim 1 comprising radiating said first RF pulse as a refocusing pulse.

4. A method as claimed in claim 1 comprising radiating said second RF pulse with said flip angle thereof being less than 70°.

5. A method as claimed in claim 1 comprising, in said MR data acquisition sequence, operating said RF radiator in order to radiate an excitation pulse that precedes said first RF pulse.

6. A method as claimed in claim 1 comprising, in said MR data acquisition sequence, operating said RF radiator in order to radiate an inversion pulse that precedes said first RF pulse.

7. A method as claimed in claim 1 comprising, in said MR data acquisition sequence, operating said RF radiator in order to radiate a preparation pulse that precedes said second RF pulse.

8. A method as claimed in claim 1 comprising, in said MR data acquisition sequence, operating said RF radiator in order to radiate a storage pulse that precedes said second RF pulse.

9. A method as claimed in claim 1 comprising, in said MR data acquisition sequence, operating said RF radiator so as to radiate a third RF pulse that acts on nuclear spins in a third slice of the subject, and preceding radiation of said third RF pulse by radiation of a further pulse selected from the group consisting of a preparation pulse and a storage pulse, with a time interval between said further pulse and said third RF pulse being longer than a time interval between said further pulse and said second RF pulse.

10. A method as claimed in claim 1 wherein said MR data acquisition sequence comprises an excitation cycle, and comprising radiating said first RF pulse and said second RF pulse multiple times in said excitation cycle.

11. A method as claimed in claim 1 comprising acquiring multiple first MR signals from said at least one first slice in at least two acquisitions, and acquiring said second MR signals from said at least one second slice also in said at least two acquisitions, with respective positions of said at least one first slice and said at least one second slice being reversed in a second of said at least two acquisitions compared to said positions in a first of said at least two acquisitions.

12. A method as claimed in claim 1 comprising radiating at least one of said first RF pulse and said second RF pulse as RF pulses of an imaging module of said measurement sequence.

13. A magnetic resonance (MR) apparatus comprising:
an MR data acquisition scanner comprising a radio-frequency (RF) radiator;
a computer configured to operate the MR data acquisition scanner in order to execute an MR data acquisition sequence in order to acquire MR data from a subject;
said computer being configured to operate the RF radiator of the MR scanner in said MR data acquisition sequence, in order to radiate a first RF pulse that acts on nuclear spins in at least one first slice of the subject;
said computer being configured to operate said RF radiator also in said MR data acquisition sequence, in order to radiate a second RF pulse that acts on nuclear spins in at least one second slice of the subject;
said computer being configured to operate said RF radiator so as to radiate said first RF pulse and said second RF pulse as respective components of a multiband RF pulse;
said computer being configured to operate said RF radiator in said MR data acquisition sequence to radiate said second RF pulse with a flip angle that is smaller than a flip angle of said first RF pulse;
said computer being configured to operate said MR scanner in said MR data acquisition sequence, so as to read out said MR data, by reading out at least one first MR signal from said at least one first slice and reading out at least one second MR signal from said at least one second slice; and
said computer being configured to reconstruct image data from said MR data and to make the image data available in electronic form from said computer as a data file.

14. A non-transitory, computer-readable data storage medium encoded with programming instructions, said storage medium being loadable into a computer of a magnetic resonance (MR) apparatus that comprises an MR data acquisition scanner having a radio-frequency (RF) radiator, said programming instructions causing said computer to:
operate the MR data acquisition scanner in order to execute an MR data acquisition sequence in order to acquire MR data from a subject;
in said MR data acquisition sequence, operate the RF radiator of the MR scanner in order to radiate a first RF pulse that acts on nuclear spins in at least one first slice of the subject;
also in said MR data acquisition sequence, operate said RF radiator in order to radiate a second RF pulse that acts on nuclear spins in at least one second slice of the subject;
operating said RF radiator so as to radiate said first RF pulse and said second RF pulse as respective components of a multiband RF pulse;
operate said RF radiator in said MR data acquisition sequence to radiate said second RF pulse with a flip angle that is smaller than a flip angle of said first RF pulse;
in said MR data acquisition sequence, operate said MR scanner so as to read out said MR data, by reading out at least one first MR signal from said at least one first slice and reading out at least one second MR signal from said at least one second slice; and
reconstruct image data from said MR data and make the image data available in electronic form from said computer as a data file.

* * * * *